(12) United States Patent
Noda et al.

(10) Patent No.: US 9,004,898 B2
(45) Date of Patent: Apr. 14, 2015

(54) MOLDING DEVICE AND MOLDING METHOD

(75) Inventors: Kazuo Noda, Tokyo (JP); Takafumi Sumiyoshi, Tokyo (JP)

(73) Assignee: Sumitomo Bakelite Company Limited, Tokyo (JP)

( * ) Notice: Subject to any disclaimer, the term of this patent is extended or adjusted under 35 U.S.C. 154(b) by 266 days.

(21) Appl. No.: 13/574,825

(22) PCT Filed: Feb. 21, 2011

(86) PCT No.: PCT/JP2011/053697
§ 371 (c)(1),
(2), (4) Date: Jul. 24, 2012

(87) PCT Pub. No.: WO2011/108386
PCT Pub. Date: Sep. 9, 2011

(65) Prior Publication Data
US 2012/0299212 A1    Nov. 29, 2012

(30) Foreign Application Priority Data
Mar. 3, 2010    (JP) ................. 2010-047145

(51) Int. Cl.
B29C 43/24    (2006.01)
B29C 43/46    (2006.01)
B29C 43/22    (2006.01)
(Continued)

(52) U.S. Cl.
CPC .............. B29C 43/46 (2013.01); B29C 33/04 (2013.01); B29C 43/222 (2013.01); B29C 47/0019 (2013.01); B29C 47/0021 (2013.01); B29C 47/8845 (2013.01); B29C 2043/3433 (2013.01); B29C 2043/468 (2013.01); B29C 2043/5076 (2013.01); B29C 33/424 (2013.01); B29C 33/56 (2013.01); B29K 2909/02 (2013.01)

(58) Field of Classification Search
CPC ....................................................... B29C 43/46
See application file for complete search history.

(56) References Cited

U.S. PATENT DOCUMENTS 2,306,265 A * 12/1942 Heald ............................. 95/254
2009/0179356 A1* 7/2009 Friedman et al. ............. 264/402
2009/0186168 A1* 7/2009 Nitta et al. ..................... 428/1.1

FOREIGN PATENT DOCUMENTS

CN    1083764 A    3/1994
GB    2 270 029 A    3/1994
(Continued)

OTHER PUBLICATIONS

Office Action issued Feb. 25, 2014, in Chinese Patent Application No. 201180006223.3.
(Continued)

Primary Examiner — Yogendra Gupta
Assistant Examiner — Kimberly A Stewart
(74) Attorney, Agent, or Firm — Birch, Stewart, Kolasch & Birch, LLP

(57) ABSTRACT

A molding device for molding a resin composition into a sheet shape by pressurizing the resin composition has a pair of rollers arranged parallel to one another. Each of the rollers has a columnar or cylindrical core portion and an outer layer provided on an outer periphery of the core portion. The outer layer is constituted of the ceramic material. A thickness of the outer layer is in the range of 0.2 to 100 nm. Further, an arithmetic mean deviation of a profile Ra of an outer peripheral surface of each of the rollers defined by JIS B 0601 is in the range of 0 to 2 μm.

14 Claims, 6 Drawing Sheets

(51) Int. Cl.
*B29C 47/00* (2006.01)
*B29C 33/04* (2006.01)
*B29C 47/88* (2006.01)
*B29C 43/34* (2006.01)
*B29C 43/50* (2006.01)
*B29C 33/42* (2006.01)
*B29C 33/56* (2006.01)

(56) References Cited

FOREIGN PATENT DOCUMENTS

| | | |
|---|---|---|
| JP | 63-99908 A | 5/1988 |
| JP | 1-321997 A | 12/1989 |
| JP | 3-133503 A | 6/1991 |
| JP | 4-71657 A | 3/1992 |
| JP | 9-29772 A | 2/1997 |
| JP | 10-180839 A | 7/1998 |
| JP | 2006-187873 A | 7/2006 |
| JP | 2006-297701 A | 11/2006 |
| JP | 2007-190905 A | 8/2007 |
| JP | 2008-137175 A | 6/2008 |
| JP | 2009-184152 * | 8/2009 ............. B29C 43/52 |
| JP | 2009-184152 A | 8/2009 |
| JP | 2009-220440 * | 10/2009 ............. B29C 47/14 |
| JP | 2009-220440 A | 10/2009 |

OTHER PUBLICATIONS

International Search Report for PCT/JP2011/053697 dated Mar. 15, 2011.
Notice of Refusal issued Aug. 5, 2014, in Japanese Patent Application No. 2010-047145, with English translation.
Office Action issued Feb. 2, 2015, in Chinese Patent Application No. 201180006223.3.

* cited by examiner

MOLDING DEVICE AND MOLDING METHOD

The present invention relates to a molding device and a molding method.

BACKGROUND OF THE INVENTION

There is known a semiconductor package in which a semiconductor chip (semiconductor element) is covered (sealed) with a resin-made sealing material. The sealing material for the semiconductor package is produced by molding a resin composition, for example, with a transfer molding method. In a process of producing the resin composition, the resin composition is molded into a sheet shape by pressurizing the resin composition between a pair of rollers (for example, see patent document 1).

Each of the rollers described in the patent document 1 has an outer peripheral surface. It is considered that the outer peripheral surface of each of the rollers is constituted of a metallic material. In case of using the rollers having the outer peripheral surface constituted of the metallic material, pulverized metals are produced by friction between the resin composition and the outer peripheral surface of each of the rollers while the rollers press the resin composition. As a result, there is a problem in that the pulverized metals are mixed into the resin composition as metallic foreign substances. In a case in which the resin composition containing the pulverized metals is used as the sealing material for the semiconductor package, it is impossible to seal the semiconductor chip in a state that the semiconductor chip is reliably insulated. As a result, there is a case in which the semiconductor chip shorts out.

Patent document 1: JP 2006-297701A

It is an object of the present invention to provide a molding device and a molding method, which are capable of reliably preventing pulverized metals from being mixed into a resin composition when the resin composition is molded into a sheet shape by pressurization.

The above object is achieved by the present invention which is specified in the following (1) to (12).

(1) A molding device for molding a resin composition into a sheet shape by pressurizing the resin composition, the molding device comprising:

a pair of rollers for molding the resin composition into the sheet shape by pressurizing the resin composition between the rollers, the pair of the rollers arranged parallel to one another, wherein at least an outer peripheral surface of each of the rollers is constituted of a ceramic material.

(2) The molding device described above (1), wherein each of the rollers has a columnar or cylindrical core portion and an outer layer provided on an outer periphery of the core portion, and the outer layer is constituted of the ceramic material.

(3) The molding device described above (2), wherein a thickness of the outer layer is in the range of 0.2 to 100 nm.

(4) The molding device described in any one of above (1) to (3), wherein the ceramic material contains an oxide ceramic.

(5) The molding device described in any one of above (1) to (4), wherein an arithmetic mean deviation of a profile Ra of the outer peripheral surface of each of the rollers defined by JIS B 0601 is in the range of 0 to 2 μm.

(6) The molding device described in any one of above (1) to (5), wherein the pair of the rollers is configured to be capable of adjusting a center distance between axes of the rollers.

(7) The molding device described in any one of above (1) to (6), wherein the molding device further comprises a cooling device for cooling the resin composition passing between the pair of the rollers.

(8) The molding device described above (7), wherein a surface temperature of the outer peripheral surface of each of the rollers is set to be equal to or less than 20° C. by the cooling device.

(9) The molding device described above in any one of above (1) to (8), wherein the molding device further has a kneading apparatus having a discharge passage, the resin composition is a kneaded composition kneaded by the kneading apparatus, and the pair of the rollers is provided at a downstream side of the discharge passage of the kneading apparatus.

(10) The molding device described above (9), wherein the kneading apparatus has a function of degassing the kneaded composition, and the kneaded composition degassed by the kneading apparatus is molded into the sheet shape by the pair of the rollers.

(11) The molding device described in any one of above (1) to (9), wherein the resin composition is used as a molding portion constituting an outer packaging of an IC package.

(12) A method for molding a resin composition into a sheet shape using a pair of rollers, the method comprising:

molding the resin composition into the sheet shape by pressurizing the resin composition between the pair of the rollers arranged parallel to one another, wherein at least an outer peripheral surface of each of the rollers is constituted of a ceramic material.

DETAILED DESCRIPTION OF THE PREFERRED EMBODIMENT

Hereinbelow, a molding device and a molding method according to the present invention will be described in detail based on the preferred embodiments shown in the accompanying drawings.

First Embodiment

Figure 1:
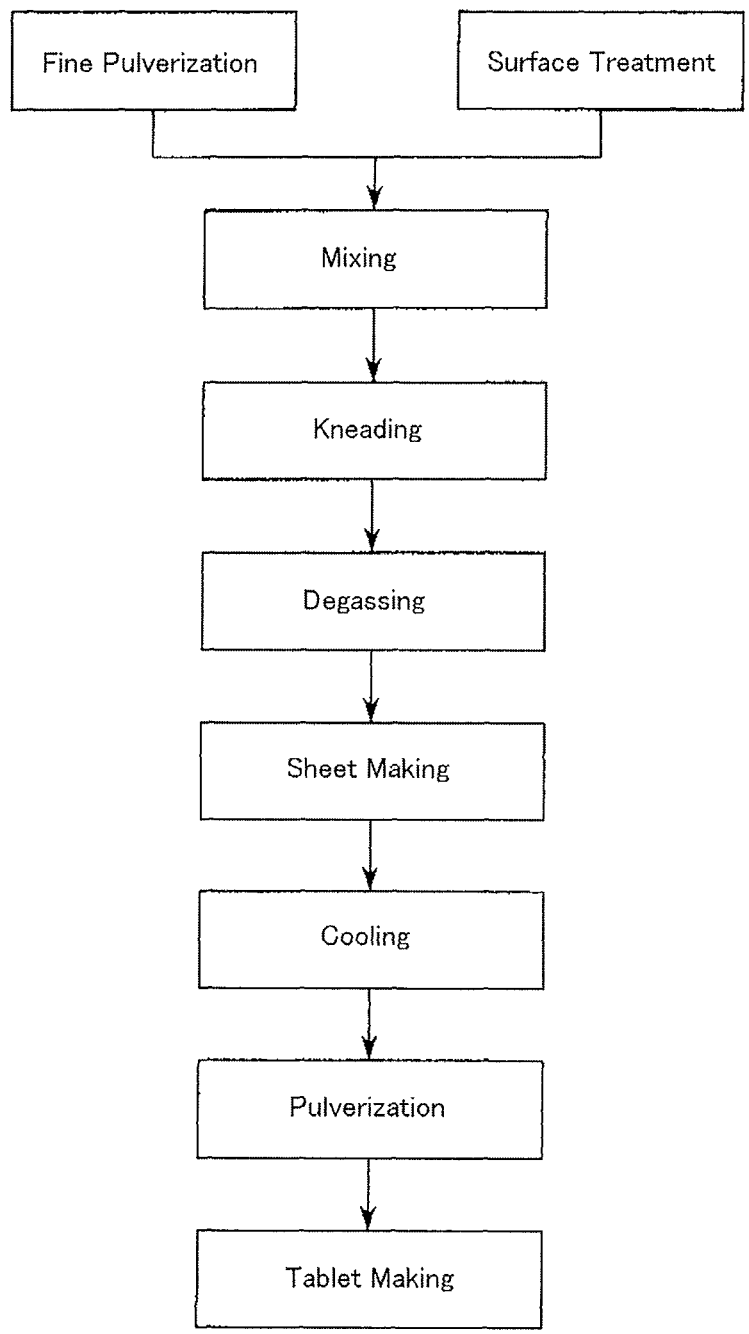
FIG. 1 is a view showing a producing process of a resin composition.
Figure 2:
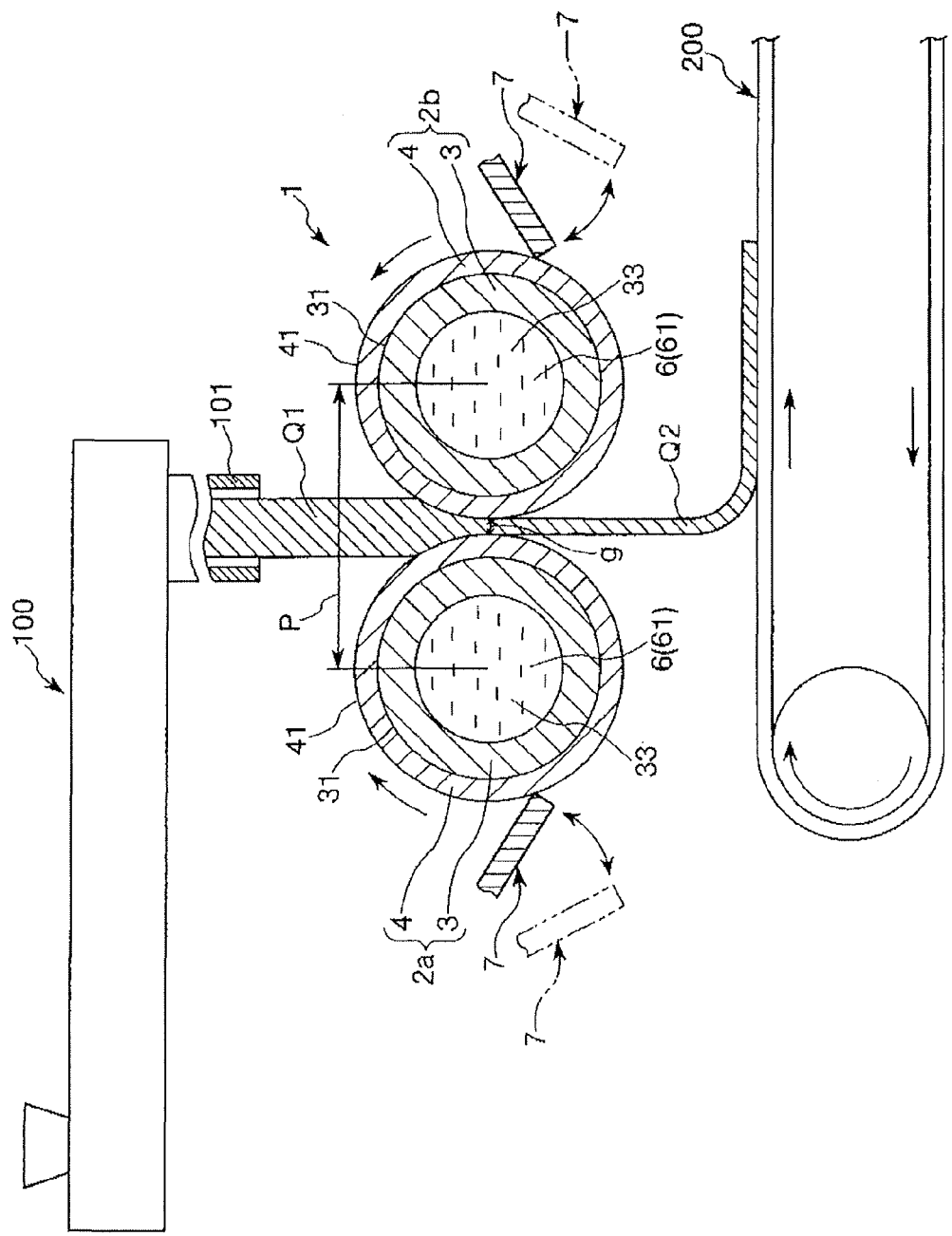
FIG. 2 is a partial cross section view showing a molding device according to one embodiment of the present invention and peripheral apparatuses.
Figure 3:
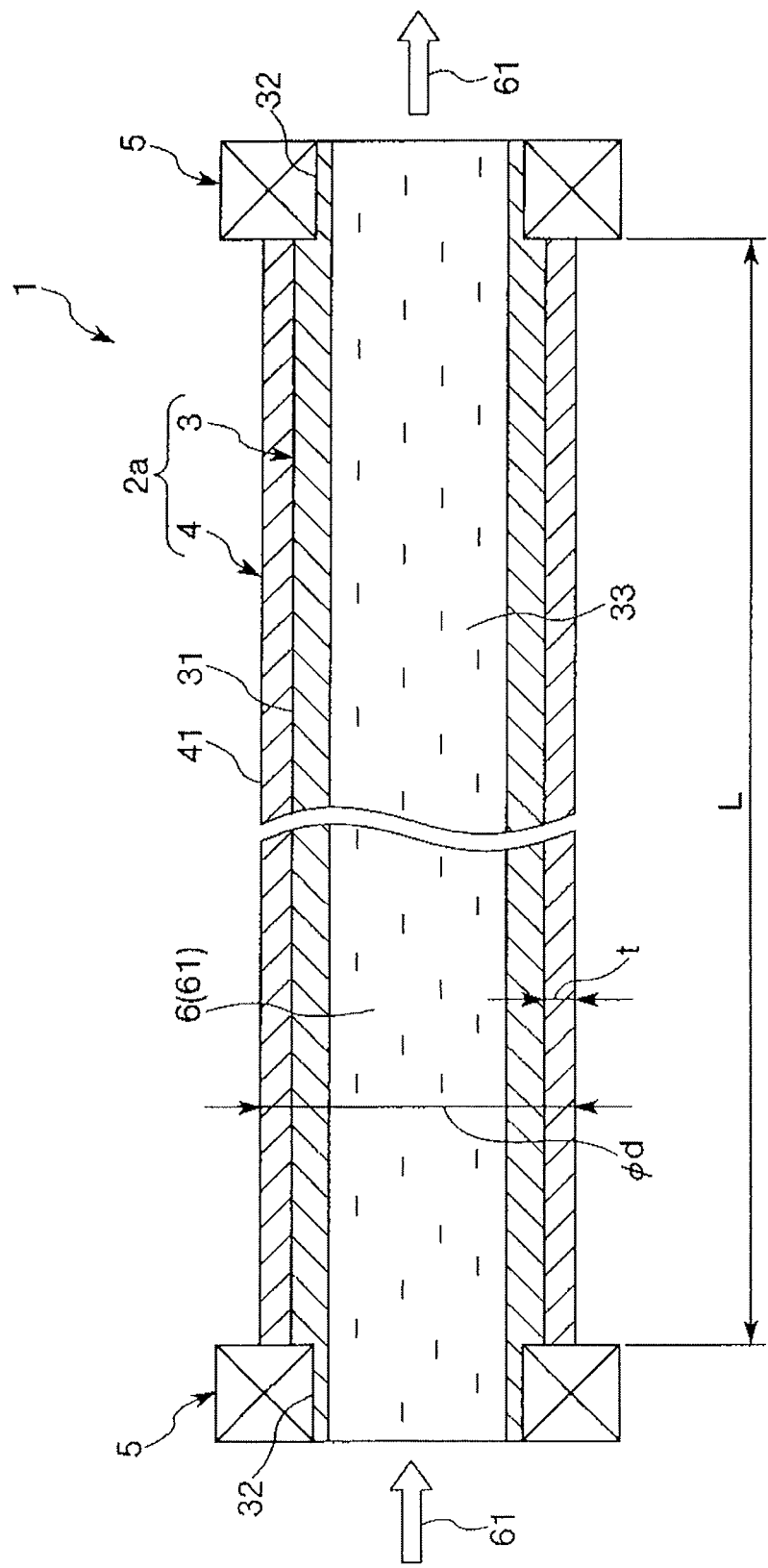
FIG. 3 is a longitudinal section view showing a roller of the molding device shown in FIG. 2.
Figure 4:
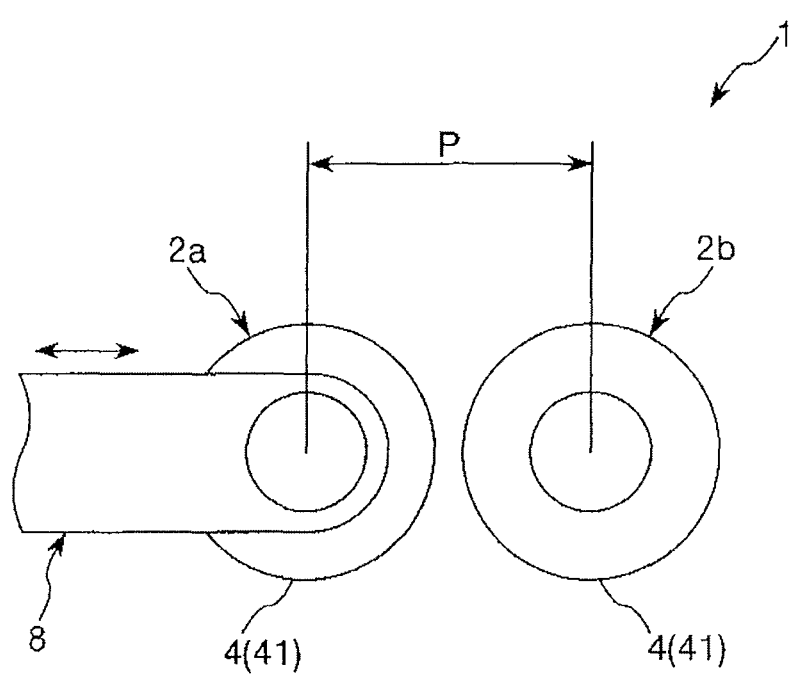
FIG. 4 is a cross view showing a molding device according to a second embodiment of the present invention.
Figure 5:
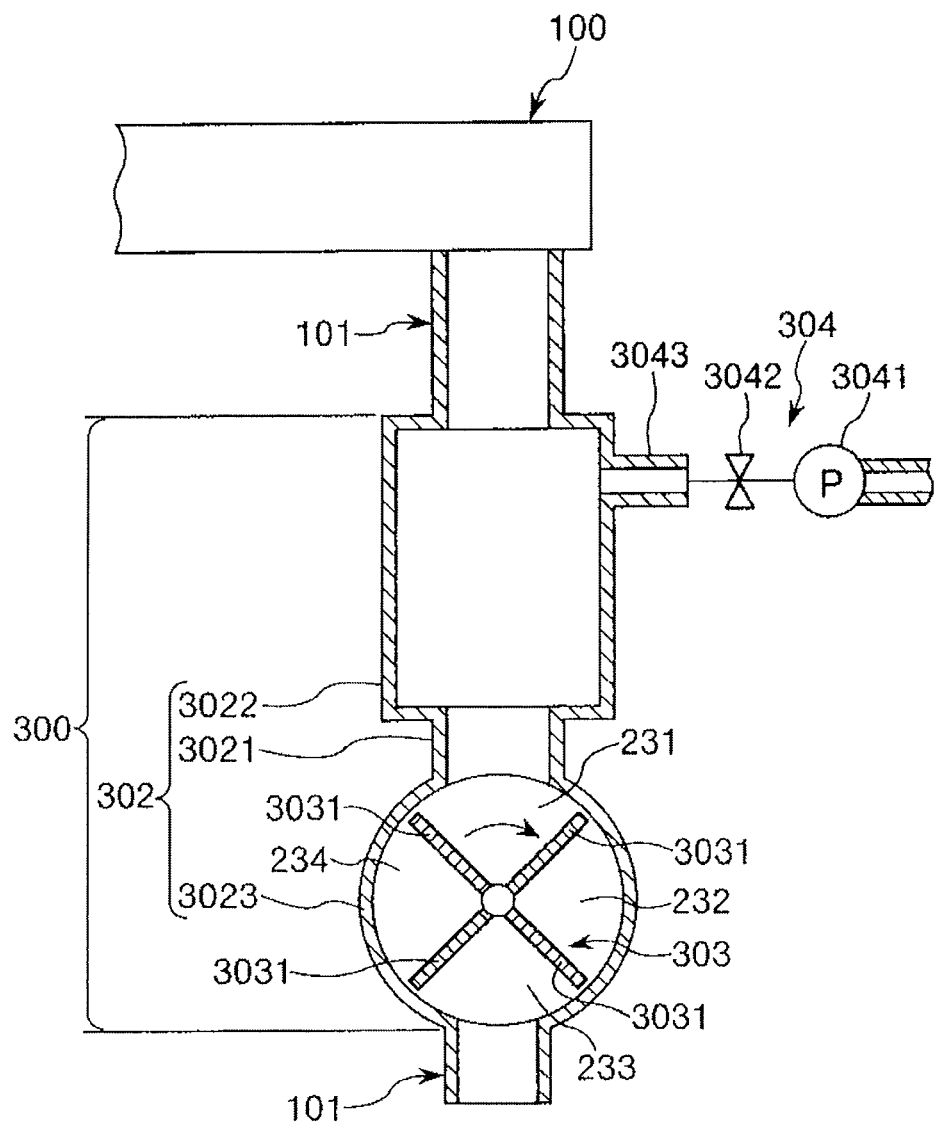
FIG. 5 is a partial cross section view showing a molding device according to a third embodiment of the present invention.
Figure 5:
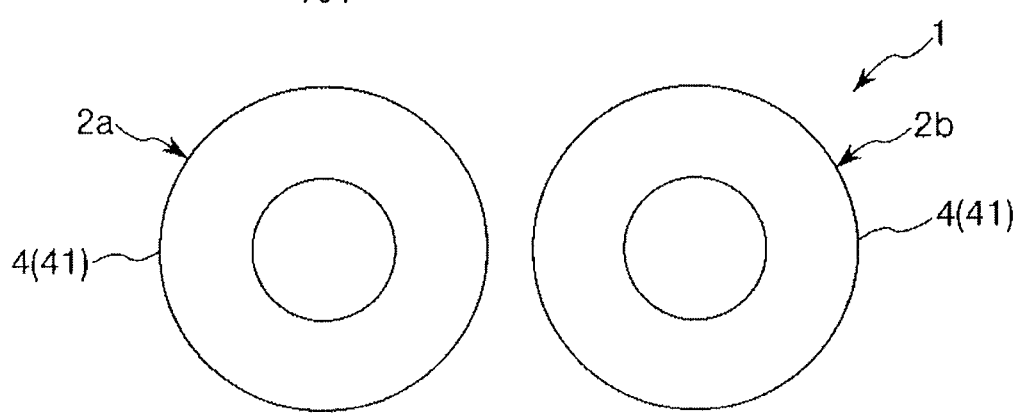
Figure 6:
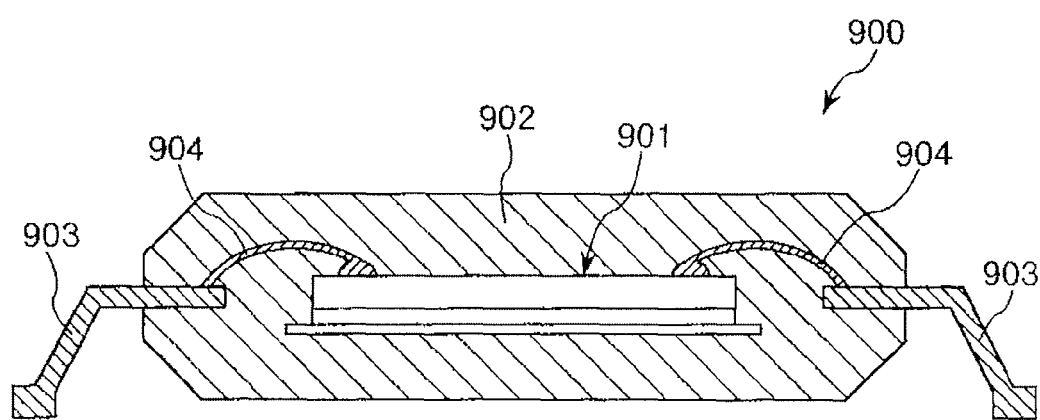
FIG. 6 is a partial section view showing an IC package using the resin composition.

FIG. 1 is a view showing a producing process of a resin composition. FIG. 2 is a partial cross section view showing a molding device according to one embodiment of the present invention and peripheral apparatuses. FIG. 3 is a longitudinal section view showing a roller of the molding device shown in FIG. 2. FIG. 4 is a cross view showing a molding device according to a second embodiment of the present invention. FIG. 5 is a partial cross section view showing a molding device according to a third embodiment of the present invention. FIG. 6 is a partial section view showing an IC package using the resin composition. In the following description, the upper side of FIGS. 2, 5 and 6 will be referred to as "upper", "upper side" or "upstream", the lower side will be referred to as "lower", "lower side" or "downstream".

A molding device 1 of the present invention shown in FIG. 2 is a device used in a sheet making process to produce a resin composition. The resin composition is finally molded into a molded body. Prior to describing the molding device 1, description will be first given to the overall producing process which begins with the supply of raw materials and ends with the production of the resin composition.

At first, individual materials as raw materials of the resin composition are prepared. The raw materials include a resin, a curing agent and a filler material (fine particle). If necessary, the raw materials may further include a curing accelerator and a coupling agent. It is preferable to use an epoxy resin as the resin.

Examples of the epoxy resin include a cresol novolac type resin, a biphenyl type epoxy resin, a dicyclopentadiene type epoxy resin, a triphenol methane type epoxy resin and a multi-ring aromatic type epoxy resin.

Examples of the curing agent include a phenol novolac type resin, a phenol aralkyl type resin, a triphenol methane type resin and a multi-ring aromatic resin.

Examples of the filler material include a fused silica (having a crushed shape or a spherical shape), a crystalline silica and an alumina.

Examples of the curing accelerator include a phosphor compound and an amine compound. Examples of the coupling agent include a silane compound and so forth.

Specific one of the materials stated above may be excluded from the raw materials. Other materials than set forth above may be further included in the raw materials. Examples of the other materials include a coloring agent, a releasing agent, a flame retardant and a stress-reducing agent.

(Fine Pulverization)

As shown in FIG. 1, specific materials among the raw materials are first pulverized (finely pulverized) by a first pulverizing apparatus to have a specified particle size distribution. Examples of the raw materials to be pulverized include the resin, the curing agent, the curing accelerator and other materials except the filler materials. A part of the filler materials may be added into the raw materials to be pulverized. As the first pulverizing apparatus, it is possible to use a continuous rotary ball mill and so forth.

(Surface Treatment)

A specified material among the raw materials, for example, all or a part (remaining part) of the filler materials, is subjected to a surface treatment. In the surface treatment, for example, the coupling agent adheres to a surface of the filler material. The fine pulverization and the surface treatment may be performed either simultaneously or one after the other.

(Mixing)

Next, a composition containing the above raw materials is thoroughly mixed by a mixing device. As the mixing device, it is possible to use, for example, a high-speed mixing device having a rotating blade.

(Kneading)

Next, the mixed composition is kneaded by a kneading apparatus 100. As the kneading apparatus 100, it is possible to use, for example, a kneading extruder such as a single-axis type kneading extruder or a double-axis type kneading extruder, or a roll type kneader such as a mixing roll and so forth.

(Degassing)

Next, the mixed composition thus kneaded (resin composition) is degassed by a degassing device. This degassing process can be performed by a vacuum pump (not shown) connected with a discharge passage 101 of the kneading apparatus 100. The discharge passage 101 of the kneading apparatus 100 discharges the resin composition thus kneaded.

(Sheet Making)

Next, the resin composition thus degassed (hereinbelow referred to as "kneaded composition Q1") is molded into a sheet shape by a molding device 1. As a result, a sheet shaped material (hereinbelow referred as "sheet shaped material Q2") is obtained. The molding device 1 will be described later.

(Cooling)

Next, the sheet shaped material Q2 is cooled by a cooling device. This makes it possible to easily and reliably perform pulverization of the sheet shaped material Q2 in a next process.

(Pulverization)

Next, the sheet shaped material Q2 is pulverized by a second pulverizing apparatus to have a specified particle size distribution. As a result, pulverized compositions are obtained. As the second pulverizing apparatus, it is possible to use a hammer mill, a grindstone type mill or a roll crusher.

(Tablet Making)

Next, the pulverized compositions are compression-molded by a compact manufacturing device (tablet-making device) to obtain resin composition in the form of compacts.

As shown in FIG. 6, the resin composition is used for, for example, covering (sealing) a semiconductor chip (IC chip) 901. And the resin composition is used as a molding portion 902 constituting an outer packaging of a semiconductor package (IC package) 900. This makes it possible to protect the semiconductor chip 901 with the molding portion 902. In order to cover the semiconductor chip 901 with the resin composition, the resin composition is molded by a transfer molding method and so forth, and then the semiconductor chip 901 is covered with the resin composition. The semiconductor package 900 shown in FIG. 6 has plural lead frames 903 protruding from the molding portion 902. Each of the lead frames 903 is electrically connected with the semiconductor chip 901 through a wire 904 constituted of a metallic material having conductive property, such as gold and so forth.

The tablet-making process may be omitted and the pulverized compositions may be used as the resin composition. In this case, the pulverized compositions are molded by, for example, a compression-molding or an injection-molding method to form a sealing material.

Next, description will be given to the molding device 1. The molding device 1 shown in FIG. 2 is a device for performing a molding method of the present invention. The molding device 1 is provided at a downstream side of the discharge passage 101 of the kneading apparatus 100. The sheet shaped material Q2 molded by the molding device 1 is conveyed to a next process by a conveyor belt 200.

The molding device 1 has a pair of rollers 2a, 2b. The rollers 2a, 2b are arranged parallel to one another in a horizontal direction. A nip between the rollers 2a, 2b is located at a lower side of the discharge passage 101 of the kneaded apparatus 100. This makes it possible to quickly pass the kneaded composition Q1 between the rollers 2a, 2b. While the kneaded composition Q1 passes between the rollers 2a, 2b, the kneaded composition Q1 is pressurized between the rollers 2a, 2b and then molded into the sheet shaped material Q2.

The molding device 1 further has a cooling device for cooling the sheet shaped material Q2 (the kneaded composition Q1) passing between the rollers 2a, 2b. The cooling device 6 simultaneously cools the rollers 2a, 2b as well as the kneaded composition Q1. This makes it possible to prevent the kneaded composition Q1 from adhering to the rollers 2a, 2b.

The number of rotation of the rollers 2a, 2b is not particularly limited to a specific number, but is preferably in the range of 1 to 100 rpm, and is more preferably in the range of 4 to 45 rpm.

A center distance between axes of the rollers 2a, 2b is constant. In this case, a length of the nip g between the rollers 2a, 2b is not particularly limited to a specific value, but is preferably in the range of 0.5 to 5 mm, and is more preferably in the range of 1 to 3 mm.

Hereinbelow, since structures of the roller 2a and structures of the roller 2b are substantially identical to each other, the roller 2a will be representatively described.

As shown in FIGS. 2 and 3, the roller 2a has a cylindrical shape. Namely, the roller 2a has a core portion 3 having a hollow structure and an outer periphery 31, and an outer layer 4 provided on the outer periphery 31 of the core portion 3.

Both end portions of the core portion 3 respectively have small diameter portions 32 whose outer diameter is smaller than other areas of the core portion 3. Each of the small diameter portions 32 is held by a shaft bearing 5 (inserted into a shaft bearing 5). Since one of the end portions of the core portion 3 is connected with a motor (not shown), it is possible to rotate the roller 2a.

A constituent material of the core portion 3 is not particularly limited to a specific material. Examples of the constituent materials include various metallic materials such as a stainless steel and so forth.

The outer layer 4 is provided on the outer peripheral surface 31 of the core portion 3 except areas on which the small diameter portions 32 are formed. The outer layer 4 has an outer peripheral surface 41 for pressurizing the kneaded composition Q1 to obtain the sheet shaped material Q2.

The outer layer 4 is constituted of a ceramic material. The ceramic material is not particularly limited to a specific material. Examples of the ceramic material include an oxide ceramic such as an alumina, a silica, a titania, a zirconia, a yttria or a calcium phosphate, a nitride ceramic such as a silicon nitride, an aluminum nitride, a titanium nitride or a boron nitride, a carbide ceramic such as a tungsten carbide or the like, and a composite ceramic containing a combination of two or more of the above ceramic materials. Among the above ceramic materials, it is preferable to use a ceramic material containing the oxide ceramic.

In a case in which the outer layer 4 is constituted of the ceramic material, even if fragments of the outer peripheral surface 41 are produced by friction between the sheet shape material Q2 and the outer peripheral surface 41 of the outer layer 4 during the sheet shaped material Q2 being molded, the fragments of the outer peripheral surface are obviously constituted of the ceramic material. In contrast, in a case in which the outer peripheral surface 41 of the outer layer 4 is constituted of a metallic material, if pulverized metals are produced by the friction between the sheet shape material Q2 and the outer peripheral surface 41 of the outer layer 4 during the sheet shaped material Q2 being molded, the pulverized metals are mixed into the sheet shaped material Q2. However, in the molding device 1, it is possible to prevent the pulverized metals from being mixed into the sheet shaped material Q2. In addition, even if the fragments are mixed into the sheet shaped material Q2, the sheet shaped material Q2 has satisfactory properties for using as the molding portion 902 of the semiconductor package 900 because the fragments are constituted of the ceramic material.

It is preferred that the outer layer 4 is constituted of the oxide ceramic. Among the oxide ceramics, it is more preferred that the outer layer 4 is constituted of the alumina which has excellent abrasion resistance and insulation properties. As a result, even if the fragments of the outer peripheral surface 41 are produced by the friction and then mixed into the sheet shaped material Q2, the sheet shaped material Q2 has satisfactory properties for using as the molding portion 902 of the semiconductor package 900.

A thickness of the outer layer 4 is not particularly limited to a specific value, but is preferably in the range of 0.2 to 100 mm, and is more preferably in the range of 0.3 to 40 mm. By setting the thickness of the outer layer 4 to fall within the above range, it is possible to cool the sheet shaped material Q2 appropriately. For example, when cooling of the outer layer 4 is insufficient, there is a case in which the sheet shaped material Q2 undesirably adheres to the outer peripheral surface 41 of the outer layer 4. As a result, it is difficult to release the sheet shaped material Q2 from the outer peripheral surface 41 of the outer layer 4. In addition, in the case in which the cooling of the sheet shaped material Q2 is carried out appropriately, it is possible to reliably prevent the outer layer 4 from occurring damages such as cracks.

A longitudinal length L of the outer layer 4 is not particularly limited to a specific value, but is preferably in the range of 300 to 1500 mm, and is more preferably in the range of 500 to 1000 mm.

A diameter φd of the roller 2a except the areas on which the small diameter portions 32 are formed is not particularly limited to a specific value, but is preferably equal to or more than 300 mm, and is more preferably in the range of 350 to 600 mm.

An arithmetic mean deviation of a profile Ra of the outer peripheral surface 41 of the outer layer 4 defined by JIS B 0601 is not particularly limited to a specific value, but is preferably in the range of 0 to 2 μm, and is more preferably in the range of 0 to 1.5 μm.

By setting the arithmetic mean deviation of the profile Ra of the outer peripheral surface 41 of the outer layer 4 to fall within the above range, it is possible to reliably prevent the sheet shaped material Q2 from adhering to the outer peripheral surface 41 of the outer layer 4. This makes it possible to reliably release the sheet shaped material Q2 from the outer peripheral surface 41 of the outer layer 4.

The cooling device 6 has a supply unit (not shown) for supplying a coolant 61 into a hollow portion 33 of the core portion 3 of each of the rollers 2a, 2b. The supply unit can be constituted of a tank for storing the coolant 61, a connecting tube for connecting the tank with the hollow portions 33 of the rollers 2a, 2b, and a pump for delivering the coolant 61.

The kneaded composition Q1 is heated by going through the above processes. When the kneaded composition Q1 is molded into the sheet shaped material Q2, it is preferable to cool the sheet shaped material Q2 with the coolant 61. This makes it possible to keep a shape of the sheet shaped material Q2. In addition, it is possible to prevent the sheet shaped material Q2 from adhering to a conveyor such as the conveyor belt 200 in the next cooling process, and to easily cool the sheet shaped material Q2 in the next cooling process.

As shown in FIG. 3, the coolant 61 is delivered from one end side (left side in FIG. 3) of the hollow portion 33 of the roller 2a to another end side (right side in FIG. 3) of the hollow portion 33 of the roller 2a. The same applies to the roller 2b. This makes it possible to circulate the coolant 61. As a result, it is possible to reliably cool the sheet shaped material Q2.

A surface temperature of the outer peripheral surface 41 of each of the rollers 2a, 2b is preferably set to be equal to or less than 20° C. by the cooling device 6, and is more preferably set to be in the range of −5 to 15° C. By setting the surface temperature of the outer peripheral surface 41 of each of the rollers 2a, 2b to fall within the above range, it is possible to optimally cool the sheet shaped material Q2. In other words, it is possible to cool the sheet shaped material Q2 appropriately.

The coolant 61 is not particularly limited to a specific material. Examples of the coolant 61 include water, oil, inorganic brine.

As shown in FIG. 2, the molding device 1 has scrapers 7 respectively provided at a side of the roller 2a and a side of the roller 2b. Structures of the scrapers 7 are substantially identical to each other, the scraper 7 provided at the side of the roller 2a will be representatively described.

The scraper 7 has a function of removing the kneaded composition Q1 remaining on the outer peripheral surface 41 of the roller 2a. The scraper 7 is a plate member constituted of a metallic material, such as a stainless steel or the like, a ceramic material or a resin material. At least a surface of the scraper 7 is preferably constituted of a nonmetallic material. The scraper 7 is supported so as to be capable of adjusting a distance from the scraper 7 to the outer peripheral surface 41 of the roller 2a. In a state that the scraper 7 contacts with the outer peripheral surface 41 of the roller 2a, the scraper 7 can remove the kneaded composition Q1 from the outer peripheral surface 41 of the roller 2a. If it is unnecessary to remove the kneaded composition Q1, the scraper 7 is spaced apart from the outer peripheral surface 41 of the roller 2a.

Second Embodiment

FIG. 4 is a cross view showing a molding device according to a second embodiment of a molding device and a molding method of the present invention.

Next, description will be given to the second embodiment of the present invention with reference to FIG. 4. Hereinbelow, the second embodiment of the molding device and the molding method will be described by placing emphasis on the points differing from the first embodiment of the molding device and the molding method, with the same matters omitted from description.

The molding device and the molding method according to the second embodiment are the same as the molding device and the molding method according to the first embodiment, except that the pair of the rollers is configured to be capable of adjusting the center distance between axes of the rollers.

In the molding device shown in FIG. 4, an arm 8 supporting the roller 2a is configured to be moved in a horizontal direction (a left-right direction in FIG. 4). This makes it possible to approach and remove the roller 2a from the roller 2b. In other words, it is possible to adjust the center distance between the axes of the rollers 2a, 2b. Therefore, in the molding device 1 according to this embodiment, it is possible to easily adjust a thickness of the sheet shaped material Q2 to a desired thickness during the sheet shaped material Q2 being molded.

Third Embodiment

FIG. 5 is a partial cross section view showing a molding device according to a third embodiment of the present invention.

Next, description will be given to the third embodiment of the present invention with reference to FIG. 5. Hereinbelow, the third embodiment of the molding device and the molding method will be described by placing emphasis on the points differing from the first and second embodiments of the molding device and the molding method, with the same matters omitted from description.

The kneading apparatus 100 has a degassing apparatus 300 provided in the middle of the discharge passage 101. The degassing apparatus 300 has a housing 302, a rotor (separating device) 303 rotatably provided in the housing 302 and a decompression mechanism (decompression device) 304 for decompressing a degassing chamber 3022 of the housing 302.

The housing 302 has the degassing chamber 3022 provided in the middle of the discharge passage 101 of the kneading apparatus 100 and a cylindrical portion 3023 having a cylindrical (tubular) shape. In the degassing chamber 3022, the kneading apparatus 100 degasses the kneaded composition Q1. The cylindrical portion 3023 is provided at a downstream side of the degassing chamber 3022.

In the configuration shown in the drawings, the degassing chamber 3022 has a tubular shape which is a rectangular in vertical cross section. A horizontal cross sectional area of an inside of the degassing chamber 3022 is set to be greater than a horizontal cross sectional area of an inside of a conduit line 3201. The horizontal cross sectional area of the inside of the degassing chamber 3022 may be set to be equal to the horizontal cross sectional area of the inside of the conduit line 3201.

In the configuration shown in the drawings, the cylindrical portion 3023 has the cylindrical shape having sealed end portions. The rotor 303 is provided in the cylindrical portion 3023 in a state that the rotor 303 is capable of rotating in a clockwise direction of FIG. 5. The rotor 303 can hermetically separate the degassing chamber 3022 from the downstream side of the degassing chamber 3022. This makes it possible to easily and reliably decompress the degassing chamber 3022. In this regard, an upstream side of the housing 302 is hermitically sealed with the kneaded composition Q1 stored in the kneading apparatus 100.

The rotor 303 has plural (in the configuration shown in the drawings, four) partitioning plates 3031 for partitioning an inside of the cylindrical portion 3023 into plural spaces (in the configuration shown in the drawings, spaces 231, 232, 233, 234). In the configuration shown in the drawings, each of the partitioning plates 3031 is arranged at equal (angle) intervals (in the configuration shown in the drawings, 90 degree intervals). The rotor 303 rotates by driving of a motor (driving force) not shown in the drawings. Due to the rotation of the rotor 303, the kneaded composition Q1 is delivered to the downstream side by the partitioning plates 3031.

In the degassing apparatus 300, a gap is formed between an inner peripheral surface of the cylindrical portion 3023 and the partitioning plate 3031. This makes it possible to prevent the partitioning plate 3031 from scratching the inner peripheral surface of the cylindrical portion 3023 while the rotor 303 rotates. As a result, it is possible to prevent pulverized materials constituted of the same material as the partitioning plate 3031 or the cylindrical portion 3023 from being mixed into the kneaded composition Q1.

A width of the gap, that is, a distance from the inner peripheral surface of the cylindrical portion 3023 and a distal end portion of the partitioning plate 3031 is preferably equal to or less than 0.2 mm, and is more preferably in the range of about 0.01 to 0.1 mm. This makes it possible to the partitioning plate 3031 from scratching the cylindrical portion 3023 while maintaining a pressure in the degassing chamber 3023.

A constitution material of the housing 302 is not particularly limited to a specific material, but at least the inner peripheral surface of the cylindrical portion 3023 is preferably constituted of a nonmetallic material. In this case, whole of the cylindrical portion 3032 may be constituted of the nonmetallic material.

A constitution material of the rotor 303 is not particularly limited to a specific material, but at least a surface of the rotor 303 is preferably constituted of a nonmetallic material. In this case, whole of the rotor 303 may be constituted of the nonmetallic material.

This makes it possible to prevent metallic foreign substances from being mixed into the kneaded composition Q1 when the kneaded composition Q1 is degassed. As a result, it is possible to prevent a short circuit and so forth when the semiconductor chip 901 is sealed with a produced resin composition.

The nonmetallic material is not particularly limited to a specific material. Examples of such nonmetallic material include, for example, the ceramic material described above and so forth.

The decompression mechanism 304 has a conduit line 3043 connected with the degassing chamber 3022 (in communicating with the inside of the degassing chamber 3022), a pump 3041 for degassing the degassing chamber 3022 through the conduit line 3043, a valve 3042 provided between the degassing chamber 3022 and the pump 3041.

At a time when the kneaded composition Q1 is degassed, the valve 3042 is opened and the pump 3041 is driven, thereby the degassing chamber 3022 is decompressed.

When the degassing chamber 3022 is decompressed, a degree of the decompression (degree of vacuum), that is, the pressure (atmosphere pressure) in the degassing chamber 3022 is not particularly limited to a specific value, but is preferably set to be equal to or less than 60 kPa, is more preferably set to be equal to or less than 50 kPa, and is even more preferably set to be in the range of about 30 to 50 kPa. This makes it possible to more reliably degas the kneaded composition Q1.

Next, description will be given to an function of the degassing apparatus 300 in the degassing process with reference to FIG. 5. As described above, the degassing chamber 3022 is hermetically separated from a downstream side of the degassing chamber 3022 by the partitioning plates 3031 of the rotor 303 provided in the cylindrical portion 3023. In other words, the housing 302 of the degassing apparatus 300 is in a sealed state in that the partitioning palates 3031 hermetically separate between the degassing chamber 3022 and the downstream side of the degassing chamber 3022.

At the time when the kneaded composition Q1 is kneaded by the kneading apparatus 100, the valve 3042 of the degassing apparatus 300 is opened and the pump 3041 is driven, thereby the degassing chamber 3022 is decompressed. Further, the rotor 303 is simultaneously rotated by the driving of the motor (not shown in the drawings). When the degassing chamber 3022 is decompressed, an upstream side of the degassing chamber 3022 is changed into a decompression state by a decompression as well as the degassing chamber 3022. Similarly, the downstream side of the degassing chamber 3022 and the space 231 partitioned with the partitioning plates 3031 provided in the cylindrical portion 3023 in communicating with the conduit line 3021 are changed into the decompression state by the decompression.

At first, the kneaded composition Q1 is introduced (applied) into the degassing chamber 300 and then is delivered to the downstream side of the degassing chamber 300 through the degassing chamber 3022 and the conduit line 3021 by its own weight (gravity). Next, the kneaded composition Q1 is stored in the space 231 formed in the cylindrical portion 3023 in communicating with the conduit line 3021. Next, the kneaded composition Q1 is degassed while the space is in communicating with the conduit line 3021. This makes it possible to remove gas, such as air or the like, and water from the kneaded composition Q1. As a result, it is possible to prevent a void from occurring when the semiconductor chip 901 is sealed with the produced resin composition, thereby it is possible to improve reliability of the semiconductor package.

Due to the rotation of the rotor 303, the resin composition stored in the space 231 is delivered by the partitioning plates 3031 and then discharged from the discharge passage 101.

While the descriptions are given to the molding device and the molding method according to the present invention shown in the drawings, the present invention is not limited thereto. Each component constituting the molding device is substituted for an arbitrary component having the same function as it. Further, arbitrary structures also may be added thereto.

Further, the molding device and the molding method of the present invention may be made by combining two or more of the arbitrary structures (features) in one of the embodiments described above.

While each of the rollers of the molding device according to the present invention has the core portion and the outer layer constituted of the ceramic material, the present invention is not limited thereto. Whole of the roller may be constituted of the ceramic material.

Further, while each of the rollers of the molding device according to the present invention has the core portion having the cylindrical shape with the hollow portion, the present invention is not limited thereto. For example, the roller may have a core portion having a columnar shape without the hollow portion.

INDUSTRIAL APPLICABILITY

With the present invention, even if fragments of an outer peripheral surface are produced by friction between a sheet shape material and the outer peripheral surface of an outer layer during the sheet shaped material being molded, the fragments of the outer peripheral surface are obviously constituted of a ceramic material. In contrast, in a case in which the outer peripheral surface of the outer layer is constituted of a metallic material, if pulverized metals are produced by the friction between the sheet shape material Q2 and the outer peripheral surface 41 of the outer layer 4 during the sheet shaped material Q2 being molded, the pulverized metals are mixed into the sheet shaped material Q2. However, in the molding device according to the present invention, it is possible to reliably prevent the pulverized metals from being mixed into the sheet shaped material. In addition, even if the fragments are mixed into the sheet shaped material Q2, the sheet shaped material Q2 has satisfactory properties for using as the molding portion 902 of the semiconductor package 900 because the fragments are constituted of the ceramic material.

What is claimed is:
1. A molding device for molding a kneaded composition into a sheet shape by pressurizing the kneaded composition, the molding device comprising:
    a kneading apparatus for kneading a resin composition to obtain the kneaded composition, the kneading apparatus having:
        a discharge passage for discharging the kneaded composition; and a degassing apparatus for degassing the kneaded composition and intermittently discharging a degassed and kneaded composition by rotating a plurality of partitioning plates for partitioning the degassed and kneaded composition so that the degassed and kneaded composition is separately stored in plural spaces, the degassing apparatus provided in the middle of the discharge passage; and a pair of rollers for molding the degassed and kneaded composition into the sheet shape by pressurizing the degassed and kneaded composition between the rollers, the pair of the rollers provided at a downstream side of the discharge passage and arranged parallel to one another, wherein at least an outer peripheral surface of each of the rollers is constituted of a ceramic material.

2. The molding device as claimed in claim 1, wherein each of the rollers has a columnar or cylindrical core portion and an outer layer provided on an outer periphery of the core portion, and the outer layer is constituted of the ceramic material.

3. The molding device as claimed in claim 2, wherein a thickness of the outer layer is in the range of 0.2 to 100 nm.

4. The molding device as claimed in claim 1, wherein the ceramic material contains an oxide ceramic.

5. The molding device as claimed in claim 1, wherein an arithmetic mean deviation of a profile Ra of the outer peripheral surface of each of the rollers defined by JIS B 0601 is in the range of 0 to 2 μm.

6. The molding device as claimed in claim 1, wherein the pair of the rollers is configured to be capable of adjusting a center distance between axes of the rollers.

7. The molding device as claimed in claim 1, wherein each of the rollers has a cooling device for cooling the kneaded composition passing between the pair of the rollers.

8. The molding device as claimed in claim 7, wherein a surface temperature of the outer peripheral surface of each of the rollers is set to be equal to or less than 20° C. by the cooling device.

9. The molding device as claimed in claim 1, wherein the degassed and kneaded composition is used as a molding portion constituting an outer packaging of an IC package.

10. The molding device as claimed in claim 1, wherein the degassing apparatus has:

a degassing chamber in which the kneaded composition is degassed;

a cylindrical portion provided at a downstream side of the degassing chamber;

a rotor rotatably provided in the cylindrical portion, the rotor having the plurality of partitioning plates for partitioning an inside of the cylindrical portion into the plural spaces; and a decompression device for decompressing the degassing chamber, and wherein the degassing apparatus is configured to hermetically seal the degassing chamber by sealing an upstream side of the degassing chamber with the kneaded composition stored in the kneading apparatus and sealing the downstream side of the degassing chamber with the plurality of partitioning plates.

11. The molding device as claimed in claim 10, wherein the degassing apparatus is configured to deliver the degassed and kneaded composition stored in the plural spaces to the downstream side of the degassing passage when the plurality of partitioning plates rotate.

12. The molding device as claimed in claim 10, wherein a surface of the rotor is constituted of a nonmetallic material.

13. The molding device as claimed in claim 1, further comprising a scraper for removing the degassed and kneaded composition remaining on the outer peripheral surface of one of the rollers.

14. The molding device as claimed in claim 13, wherein a surface of the scraper is constituted of a nonmetallic material.

* * * * *